United States Patent
Mori et al.

(10) Patent No.: US 8,810,008 B2
(45) Date of Patent: Aug. 19, 2014

(54) SEMICONDUCTOR ELEMENT-EMBEDDED SUBSTRATE, AND METHOD OF MANUFACTURING THE SUBSTRATE

(75) Inventors: Kentaro Mori, Minato-ku (JP);
Shintaro Yamamichi, Minato-ku (JP);
Hideya Murai, Minato-ku (JP);
Katsumi Kikuchi, Minato-ku (JP);
Yoshiki Nakashima, Minato-ku (JP);
Daisuke Ohshima, Minato-ku (JP)

(73) Assignee: NEC Corporation, Tokyo (JP)

( * ) Notice: Subject to any disclaimer, the term of this patent is extended or adjusted under 35 U.S.C. 154(b) by 26 days.

(21) Appl. No.: 13/635,621

(22) PCT Filed: Jan. 25, 2011

(86) PCT No.: PCT/JP2011/051295
§ 371 (c)(1),
(2), (4) Date: Sep. 17, 2012

(87) PCT Pub. No.: WO2011/114774
PCT Pub. Date: Sep. 22, 2012

(65) Prior Publication Data
US 2013/0009325 A1    Jan. 10, 2013

(30) Foreign Application Priority Data
Mar. 18, 2010 (JP) ................................ 2010-062776

(51) Int. Cl.
*H01L 29/40* (2006.01)
*H01L 21/4763* (2006.01)

(52) U.S. Cl.
USPC .................. 257/621; 257/774; 257/E21.597; 438/629; 438/630

(58) Field of Classification Search
USPC ........... 257/621, 774, E21.597; 438/629, 630
See application file for complete search history.

(56) References Cited

U.S. PATENT DOCUMENTS

| | | | | |
|---|---|---|---|---|
| 8,587,129 | B2 * | 11/2013 | Chi et al. | 257/776 |
| 2008/0303163 | A1 * | 12/2008 | Liu et al. | 257/772 |
| 2009/0115026 | A1 * | 5/2009 | Gerber et al. | 257/621 |
| 2011/0155433 | A1 * | 6/2011 | Funaya et al. | 174/258 |

FOREIGN PATENT DOCUMENTS

| | | |
|---|---|---|
| JP | 4-18787 A | 1/1992 |
| JP | 2005-285945 A | 10/2005 |
| JP | 2005-311240 A | 11/2005 |
| JP | 2006-49424 A | 2/2006 |
| JP | 2008-159805 A | 7/2008 |
| JP | 2010-21368 A | 1/2010 |
| WO | 2010/024233 A1 | 3/2010 |

* cited by examiner

*Primary Examiner* — Long K Tran
(74) *Attorney, Agent, or Firm* — Sughrue Mion, PLLC

(57) ABSTRACT

A semiconductor element-embedded substrate includes a semiconductor element; a chip component; a peripheral insulating layer covering at least the outer circumferential side surfaces thereof; an upper surface-side wiring line provided on the upper surface side of the substrate; and a lower surface-side wiring line provided on the lower surface side of the substrate. The built-in semiconductor element includes a terminal on the upper surface side thereof, and this terminal is electrically connected to the upper surface-side wiring line. The built-in chip component includes an upper surface-side terminal electrically connected to the upper surface-side wiring line; a lower surface-side terminal electrically connected to the lower surface-side wiring line; and a through-chip via penetrating through the chip component to connect the upper surface-side terminal and the lower surface-side terminal.

29 Claims, 12 Drawing Sheets

SEMICONDUCTOR ELEMENT-EMBEDDED SUBSTRATE, AND METHOD OF MANUFACTURING THE SUBSTRATE

CROSS REFERENCE TO RELATED APPLICATIONS

This application is a National Stage of International Application No. PCT/JP2011/051295 filed on Jan. 25, 2011, which claims priority from Japanese Patent Application No. 2010-062776, filed on Mar. 18, 2010, the contents of all of which are incorporated herein by reference in their entirety.

TECHNICAL FIELD

The present invention relates to a semiconductor element-embedded substrate, and a method of manufacturing the substrate.

BACKGROUND ART

In recent years, there has been used a three-dimensional mounting technique of stacking and mounting chips within a package, in order to realize the downsizing, thinning, functional upgrading, and performance enhancement of electronic equipment.

Various techniques are available, including a chip layering technique of interconnecting chips by using a through-via (TSV: Through Silicon Via) provided in the LSI chip, a chip layering technique of interconnecting chips within a single package by wire bonding or by using solder bumps, and a package layering technique of stacking a plurality of packages at a package level, in order to three-dimensionally configure an LSI device.

Of the above-described techniques, a technique which holds promise for the highest degree of functional upgrading and performance enhancement is the chip layering technique using TSVs. Unfortunately, however, this technique involves the necessity to form TSVs in a region where any LSI circuits are not present. Thus, the technique is subject to many layout constraints resulting from keep-out zones. In addition, future logic LSIs tend to become smaller in chip size. Accordingly, the technique has difficulty in densifying TSVs. Yet additionally, the technique has the problem that the yield rate of TSV formation affects the yield rate of chips as a whole including a yield in a step of LSI circuit formation, no matter whether the TSV formation is performed before or after the step of LSI circuit formation.

In contrast, the chip layering technique of interconnecting chips within a single package by wire bonding or by using solder bumps can realize three-dimensional configuration with a relatively high yield. Connection terminals on a chip are limited to those on the periphery thereof, however, in the case of interconnection by wire bonding. In addition, it is difficult to stack more than three chips in the case of interconnection using solder bumps. Thus, these chip layering techniques have the problem of difficulty in high-density packaging.

On the other hand, such a package layering technique as package-on-package is widely used with a focus on cellular phone applications for reasons of ease in combining functions and advantage in reducing costs. In package-on-package techniques currently in practical use, however, the pin location of a package to be mounted on an upper stage is limited to a peripheral part. Consequently, a restriction is placed on the number of pins of an LSI chip in a lower-stage package. In addition, package layering techniques have the problem that a height at which packages are mounted is greater, compared with a height in the case of chip layering techniques.

Hence, an LSI-embedded substrate in which an LSI chip is built in a package substrate is a focus of attention as means for realizing thinning, downsizing, and an increase in the number of pins in a package-level three-dimensional structure, particularly in a package-on-package lower-stage structure.

Patent Literature 1 discloses a semiconductor device having a package structure in which a chip is mounted within a wiring board. This semiconductor device includes a core substrate including, on the upper and the lower sides thereof, conductor layers conductive to each other by way of a through-hole; a chip mounted on this core substrate with a circuit-formed surface of the chip facing up; an insulating layer covering this chip; an on-chip wiring line connected to an electrode of this chip; an upper surface-side wiring line of a package connected to this wiring line through a via; and a via for connection with the conductor layers on the core substrate in an insulating layer lateral to the chip. In addition, an insulating layer is provided on the lower surface side of the core substrate, a via conductive to the via lateral to the chip is provided in this insulating layer, and a wiring line for connection with this via is provided on the lower surface side of the package.

CITATION LIST

Patent Literature

Patent Literature 1: JP2005-311240A

SUMMARY OF INVENTION

Technical Problem

The semiconductor device described in the abovementioned patent literature includes wiring lines on both sides thereof and, in order to make these wiring lines conductive to each other, a via is provided in the insulating layer lateral to the built-in chip. The height of this via is determined according to the height of a chip to be built in. Accordingly, a large-diameter via need to be provided if the chip is thick, thus causing difficulty in densifying vias. This densification of vias is realizable if vias having a high aspect ratio can be formed. It becomes more difficult to form holes or fill a conductive material in the holes at the time of forming vias, however, as the aspect ratio becomes higher.

In addition, higher-level optimization is required in every process, and therefore, yield degradation tends to occur, if pitches are narrowed or via diameters are reduced in an attempt to densify vias, in addition to applying a high aspect ratio. This is because a semiconductor device generally goes through many steps, including laser processing, desmear, seed layer formation, resist film formation, resist patterning, plating treatment, resist separation, and seed layer removal, in a via formation process.

Another problem is that since via formation is performed after a chip is built in, the yield of vias is directly linked to the yield of a chip-embedded substrate.

An object of the present invention is to provide a small, thin semiconductor element-embedded substrate that can be manufactured with a high yield, and a method of manufacturing the substrate.

Solution to Problem

According to one aspect of the present invention, there is provided a semiconductor element-embedded substrate which is a wiring substrate including a semiconductor element built therein, the wiring substrate including:

the semiconductor element;

a chip component;

a peripheral insulating layer covering at least outer circumferential side surfaces of the semiconductor element and the chip component;

an upper surface-side wiring line provided on the upper surface side of the wiring substrate; and a lower surface-side wiring line provided on the lower surface side of the wiring substrate, wherein the semiconductor element includes a terminal on the upper surface side thereof, the terminal being electrically connected to the upper surface-side wiring line, and the chip component includes:

an upper surface-side terminal electrically connected to the upper surface-side wiring line;

a lower surface-side terminal electrically connected to the lower surface-side wiring line; and a through-chip via penetrating through the chip component to connect the upper surface-side terminal and the lower surface-side terminal.

According to another aspect of the present invention, there is provided a method of manufacturing a wiring substrate including a semiconductor element built therein, the method including:

mounting a semiconductor element including a terminal on the upper surface side thereof on a support medium with the lower surface of the semiconductor element facing the support medium side;

mounting a chip component including terminals on the upper surface side and the lower surface side thereof on the support medium;

forming a peripheral insulating layer for covering the semiconductor element and the chip component;

removing the support medium;

forming a first wiring line for electrical connection with the lower surface-side terminal of the chip component; and forming a second wiring line for electrical connection with the terminal of the semiconductor element and the upper surface-side terminal of the chip component, wherein the chip component includes a through-chip via penetrating through the chip component to connect the upper surface-side terminal and the lower surface-side terminal.

This manufacturing method further includes forming a foundation insulating layer on the support medium, thereby enabling the semiconductor element and the chip component to be mounted on the foundation insulating layer.

In addition, in this manufacturing method, the semiconductor element and the chip component may be respectively mounted through adhesion layers.

According to yet another aspect of the present invention, there is provided a method of manufacturing a wiring substrate including a semiconductor element built therein, the method including:

forming at least a first wiring line on a support medium;

mounting a semiconductor element including a terminal on the upper surface side thereof on the support medium with the lower surface of the semiconductor element facing the support medium side;

mounting a chip component including terminals on the upper surface side and the lower surface side thereof on the support medium, such that the lower surface-side terminal is electrically connected to the first wiring line;

forming a peripheral insulating layer for covering the semiconductor element and the chip component;

removing the support medium; and forming a second wiring line for electrical connection with the terminal of the semiconductor element and the upper surface-side terminal of the chip component, wherein the chip component includes a through-chip via penetrating through the chip component to connect the upper surface-side terminal and the lower surface-side terminal.

In this manufacturing method, a multilayer interconnection structure including the first wiring line as an uppermost layer-side wiring line and including wiring lines and insulating layers alternately provided on the support medium may be formed in the formation of the first wiring line. In this case, the semiconductor element and the chip component can be mounted on the multilayer interconnection structure, and the lower surface-side terminal of the chip component can be electrically connected to the first wiring line.

In addition, in this manufacturing method, the lower surface-side terminal of the chip component may be connected to the first wiring line through a solder member.

The peripheral insulating layer may include a first insulating layer surrounding the outer circumferential side surfaces of the semiconductor element and the chip component and a second insulating layer covering the upper surfaces of the semiconductor element and the chip component. This first insulating layer may include a reinforcing material.

Advantageous Effect of Invention

According to the present invention, it is possible to provide a small, thin semiconductor element-embedded substrate that can be manufactured with a high yield, and a method of manufacturing the substrate.

DESCRIPTION OF EMBODIMENTS

Figure 1:
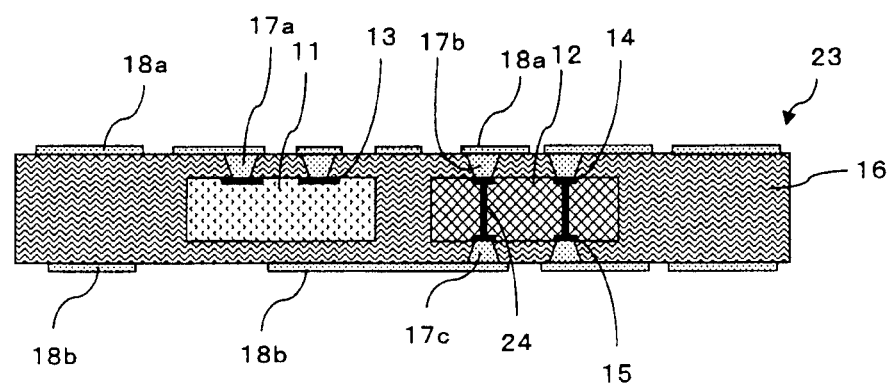
FIG. 1 is a cross-sectional view illustrating a semiconductor element-embedded substrate according to a first exemplary embodiment of the present invention.

A semiconductor element-embedded substrate according to one exemplary embodiment includes a semiconductor element; a chip component; a peripheral insulating layer covering at least outer circumferential side surfaces of the semiconductor element and the chip component; an upper surface-side wiring line provided on the upper surface side of the substrate; and a lower surface-side wiring line provided on the lower surface side of the substrate.

The built-in semiconductor element includes a terminal on the upper surface side thereof, and this terminal is electrically connected to the upper surface-side wiring line. The terminal of this semiconductor element can be connected to the upper surface-side wiring line through a via. As this semiconductor element, a semiconductor chip including a semiconductor circuit can be used.

The built-in chip component can be located laterally to the semiconductor element. The chip component includes an upper surface-side terminal electrically connected to the upper surface-side wiring line, a lower surface-side terminal electrically connected to the lower surface-side wiring line, and a through-chip via penetrating through the chip component to connect this upper surface-side terminal and this lower surface-side terminal. The upper surface-side terminal of this chip component can be connected to the upper surface-side wiring line through a via. The lower surface-side terminal of this chip component can be connected to the lower surface-side wiring line through a via or a solder member. As this chip component, it is possible to use a semiconductor chip not including any semiconductor circuits.

The above-described peripheral insulating layer can include a lower surface-side insulating layer for covering the lower surface of the built-in semiconductor element and the lower surface of the built-in chip component; a reinforcing insulating layer for surrounding the outer circumferential side surfaces of this semiconductor element and the outer circumferential side surfaces of this chip component; and an upper surface-side insulating layer for covering the upper surface of this semiconductor element and the upper surface of this chip component. The reinforcing insulating layer can contain a reinforcing material, such as glass cloth. These insulating layers may be formed of a material of the same type so as to be integrated, or each adjacent two insulating layers may be formed of materials different from each other so as to form the layers into a laminated structure.

A lateral-to-chip via penetrating through the peripheral insulating layer can be provided in a region around the built-in semiconductor element and chip component. This lateral-to-chip via can be connected to the upper surface-side wiring line and the lower surface-side wiring line of the semiconductor element-embedded substrate.

The diameter of this lateral-to-chip via can be made larger than the diameter of the through-chip via. In this case, power or ground can be applied through the large-diameter lateral-to-chip via, and a signal can be conducted through the small-diameter through-chip via.

Note that the notion that the via diameter of one via A is larger than the via diameter of the other via B in a case where, in comparison between the outer diameters of vias (hereinafter referred to as "via diameters"), via diameters differ in a direction perpendicular to a substrate plane (direction from the upper end to the lower end of a via) means that the minimum via diameter of the via A is larger than the maximum via diameter of the via B. If the cross section of a via in a direction along the substrate plane (hereinafter referred to as "via cross section") is polygonal (rectangular column) or elliptical, then the maximum outer diameter of the via cross section is defined as the via diameter of the via (for example, the via diameter is defined as the length of a diagonal line in the case of a rectangle or a square, or the length of a major axis in the case of an ellipse).

The planar area of the built-in chip component can be made larger than the planar area of the built-in semiconductor element. Here, the phrase "planar area" refers to an area projected to the substrate plane.

Figure 4:
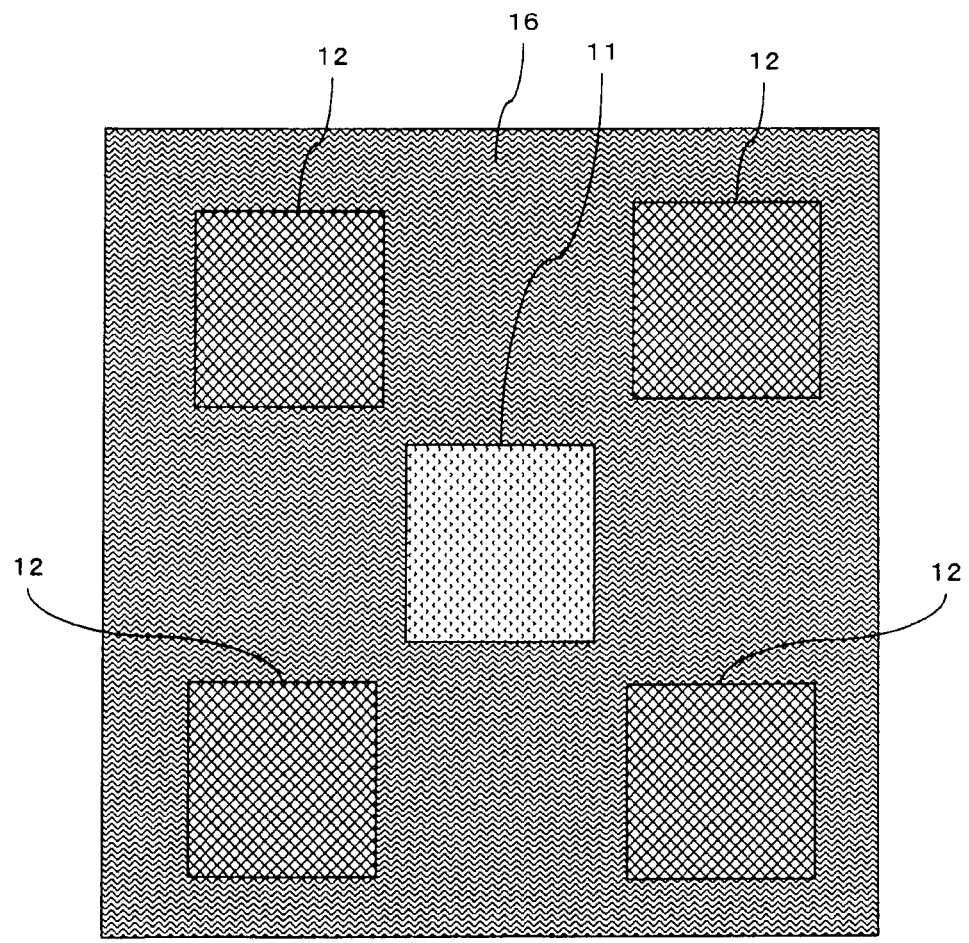
FIG. 4 is a plan view illustrating yet another layout example of built-in chips in the semiconductor element-embedded substrate according to the first exemplary embodiment of the present invention.

A plurality of chip components may be built in the substrate. In that case, the plurality of chip components can be disposed so as to surround the outer circumferential side surfaces of the built-in semiconductor element. If the planar shape of the semiconductor element is a square or a rectangle, four chip components can be respectively disposed in four directions of the semiconductor element. For example, four chip components the same in both shape and size can be respectively disposed on extensions of the diagonal lines of the semiconductor element, as illustrated in FIG. 4. Alternatively, the four chip components the same in both shape and size can be respectively disposed so as to be opposed to the respective sides of the semiconductor element. This layout enables a reduction in stress stemming from an insulating resin layer, applied to the sidewalls of the semiconductor element. Thus, this layout holds promise of reducing the warpage of the semiconductor element.

From the viewpoint of downsizing, a distance between each built-in chip component and the semiconductor element adjacent to this chip component can be set to, for example, 500 μm or shorter, preferably 100 μm or shorter, and further can be set to 10 μm or shorter. Reducing this distance enables the reduction of stress stemming from the insulating resin layer, applied to the sidewalls of the semiconductor element, in addition to the downsizing of a wiring board. The reduction in the distance holds promise of reducing the warpage of a thinned semiconductor element. An increase in this distance makes a chip-to-chip wiring line longer, thereby allowing an increase in the freedom of wiring design. Increasing the distance is also advantageous in that, for example, a wiring width and a wiring pitch can be increased. Accordingly, the distance can be set by taking into consideration these advantages. From the viewpoint of these advantages and the accuracy of chip mounting, the distance between each chip component and the semiconductor element is preferably set to 1 μm or longer. Note that the distance between each chip component and the semiconductor element refers to the shortest distance at which the chip component and the semiconductor element are connected to each other in the planar direction of the substrate.

The semiconductor element-embedded substrate according to the present exemplary embodiment can include a protective insulating film for covering the upper surface-side wiring line, the protective insulating film having an opening, and can include an external terminal formed of an exposed portion of the upper surface-side wiring line within this opening, or an external terminal made of a conductive part provided in this opening.

The semiconductor element-embedded substrate according to the present exemplary embodiment can include a protective insulating film for covering the lower surface-side wiring line, the protective insulating film having an opening, and can include an external terminal formed of an exposed portion of the lower surface-side wiring line within this opening, or an external terminal made of a conductive part provided in this opening.

The semiconductor element-embedded substrate according to the present exemplary embodiment may include a multilayer wiring structure including wiring lines and insulating layers alternately provided on the upper surface side of the substrate. The lowermost layer side wiring line of this multilayer wiring structure corresponds to the abovementioned upper surface-side wiring line. In addition, the substrate can include an insulating layer having an opening on the uppermost layer side of this multilayer wiring structure, an external terminal formed of an exposed portion of the wiring line within this opening, or an external terminal made of a conductive part provided in this opening.

The semiconductor element-embedded substrate according to the present exemplary embodiment may include a multilayer wiring structure including wiring lines and insulating layers alternately provided on the lower surface side of the substrate. The uppermost layer-side wiring line of this multilayer wiring structure corresponds to the abovementioned lower surface-side wiring line. In addition, the substrate can include an insulating layer having an opening on the lowermost layer side of this multilayer wiring structure, an external terminal formed of an exposed portion of the wiring line within this opening, or an external terminal made of a conductive part provided in this opening.

The terminal pitch of the built-in semiconductor element and chip component can be made narrower than the pitch of external terminals on both sides of the semiconductor element-embedded substrate.

As described above, the semiconductor element-embedded substrate according to one exemplary embodiment includes a semiconductor element (hereinafter referred to as "IC chip", for example, an LSI chip) having a semiconductor circuit (for example, an LSI circuit) and a terminal on one side thereof, and a chip component (hereinafter referred to as "TSV chip") including a through-chip via (hereinafter referred to as "TSV") and terminals connected to this TSV on both sides of the chip component.

This TSV chip can be treated as "chip component having via functions." Like an IC chip, this TSV chip can be embedded in an insulating layer and can thereby be built in the substrate.

Such a TSV chip allows the upper surface-side wiring line and the lower surface-side wiring line of the semiconductor element-embedded substrate to be electrically connected to each other through a TSV within this chip. Hence, the TSV chip can be substituted for a via provided in an insulating layer lateral to an IC chip (hereinafter referred to as "lateral-to-chip via"). As a result, the semiconductor element-embedded substrate can be manufactured with a high yield.

In addition, a TSV in this TSV chip can be made narrower in pitch, higher in aspect ratio, and smaller in diameter, compared with the lateral-to-chip via. This makes it easy to build in a multipin, narrow-pitch IC chip (for example, a CPU-class LSI chip). As a result, it is possible to downsize and thin electronic equipment.

Since the TSV chip can be located in a desired region around the IC chip, TSVs of varying size can be located in desired places. Consequently, the freedom of wiring design increases, and therefore, it is possible to provide a highly-functional, high-performance semiconductor element-embedded substrate.

By manufacturing the TSV chip and the IC chip independently by using separate wafers, and inspecting and embedding the chips, the semiconductor element-embedded substrate can be manufactured with a higher yield, compared with structures including LSI chips having TSVs. Thus, it is possible to realize cost reductions.

Stress stemming from side surfaces of the IC chip is reduced by disposing TSV chips around the IC chip. Thus, it is possible to reduce warpage to be caused when the IC chip is thinned.

Since a TSV of the TSV chip can be easily made high in aspect ratio, a built-in IC chip need not be thinned from the viewpoint of TSV formation. This reduces yield decline due to handleability degradation and warpage caused by the thinning of the IC chip.

By applying, as another exemplary embodiment, an interconnection structure in which a signal is conducted through a small-diameter TSV and a supply power and a ground are applied through large-diameter lateral-to-chip vias, it is possible to improve electrical characteristics, such as power source characteristics.

By integrating via areas around the IC chip into the TSV chip, a support medium, such as a solid copper film, can be provided in space areas thus obtained. Consequently, it is possible to reduce the warpage of the semiconductor element-embedded substrate.

In addition, a wiring distance from a terminal of the IC chip to a via area can be shortened by integrating via areas around the IC chip into the TSV chip. Consequently, it is possible to improve signal characteristics.

As a semiconductor substrate (base material) used in the IC chip, it is possible to use a substrate made of, for example, silicon, germanium, gallium arsenide (GaAs), gallium arsenide phosphide, gallium nitride (GaN), silicon carbide (SiC), zinc oxide (ZnO), other compound semiconductors (II-VI group compounds, III-V group compounds, and VI group compounds), or diamond, though the substrate material is not limited to these. As the IC chip, it is possible to suitably use a chip using a silicon substrate.

As the base material of the TSV chip, a semiconductor substrate of the same type as that used in the IC chip is preferably used from the viewpoint of reducing a difference in thermal expansion coefficient and reducing warpage. In addition, it is preferable to use a material high in thermal conductivity, particularly preferably a silicon material, from the viewpoint of heat dissipation.

A TSV chip can be fabricated by applying a usual method of forming a via penetrating through a semiconductor chip. For example, the TSV chip can be formed in the following manner. First, holes are formed on the upper surface side of a wafer (chip base material). Next, a conductive material is filled in these holes to form plugs. Thereafter, the lower surface of the wafer is ground to thin the wafer, so that the lower end of each plug becomes exposed. As a result, there are obtained plugs penetrating through the wafer, i.e., TSVs. Then, chips (TSV chips) including TSVs can be obtained by dicing this wafer.

Hereinafter, exemplary embodiments will be described specifically with reference to the accompanying drawings.

First Exemplary Embodiment

FIG. 1 is a cross-sectional view illustrating a semiconductor element-embedded substrate according to a first exemplary embodiment.

As illustrated in FIG. 1, a semiconductor element-embedded substrate 23 incorporates an LSI chip 11 including a terminal 13 on the upper surface thereof, and a TSV chip 12 including a terminal 14 and a terminal 15 on the upper surface and the lower surface thereof, respectively. These chips are covered with an insulating layer 16. A wiring line 18a is provided on the upper surface side of this semiconductor element-embedded substrate, and a wiring line 18b is provided on the lower surface side of the substrate. The terminal 13 of the LSI chip is electrically connected to the upper surface-side wiring line 18a through a via 17a. The upper surface-side terminal 14 of the TSV chip 12 is electrically connected to the upper surface-side wiring line 18a through a via 17b. The lower surface-side terminal 15 is electrically connected to the lower surface-side wiring line 18b through a via 17c. An LSI circuit (not illustrated) is provided on the upper surface side of the LSI chip 11. A through-via (TSV) 24 for connecting the upper surface-side terminal 14 and the lower surface-side terminal 15 is provided within the TSV chip 12.

FIGS. 2 to 5 are plan views illustrating examples of the layouts and planar shapes of the built-in LSI chip 11 and each TSV chip 12. In these figures, the LSI chip and each TSV chip are viewed perspectively, and constituent members located on and above these chips are omitted.

Figure 2:
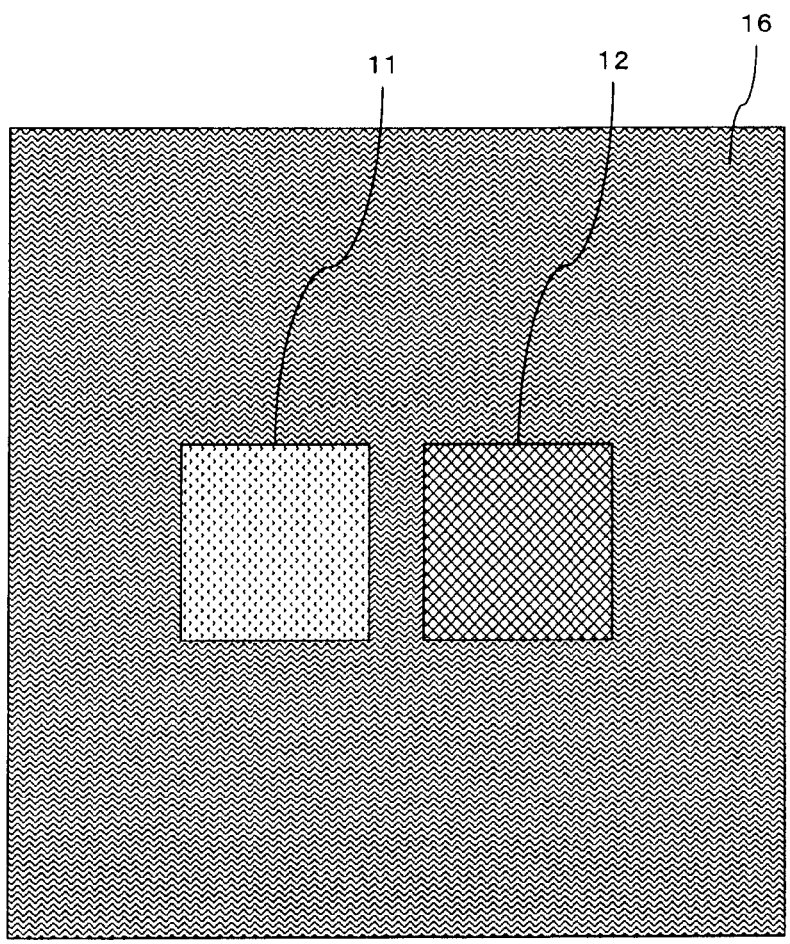
FIG. 2 is a plan view illustrating a layout example of built-in chips in the semiconductor element-embedded substrate according to the first exemplary embodiment of the present invention.

In FIG. 2, an LSI chip 11 and a TSV chip 12 of the same shape and size are arranged side by side. Each chip can be located in a desired region and is high in design freedom. Thus, each chip can be located so as to enhance the electrical characteristics thereof. In addition, setting the LSI chip 11 and the TSV chip 12 to the same size and shape, as illustrated in FIG. 2, improves the mounting accuracy of each chip, thereby enabling the cost reduction thereof. The mounting accuracy can be made higher in the case of a chip square in planar shape than in the case of a chip having other shapes.

Figure 3:
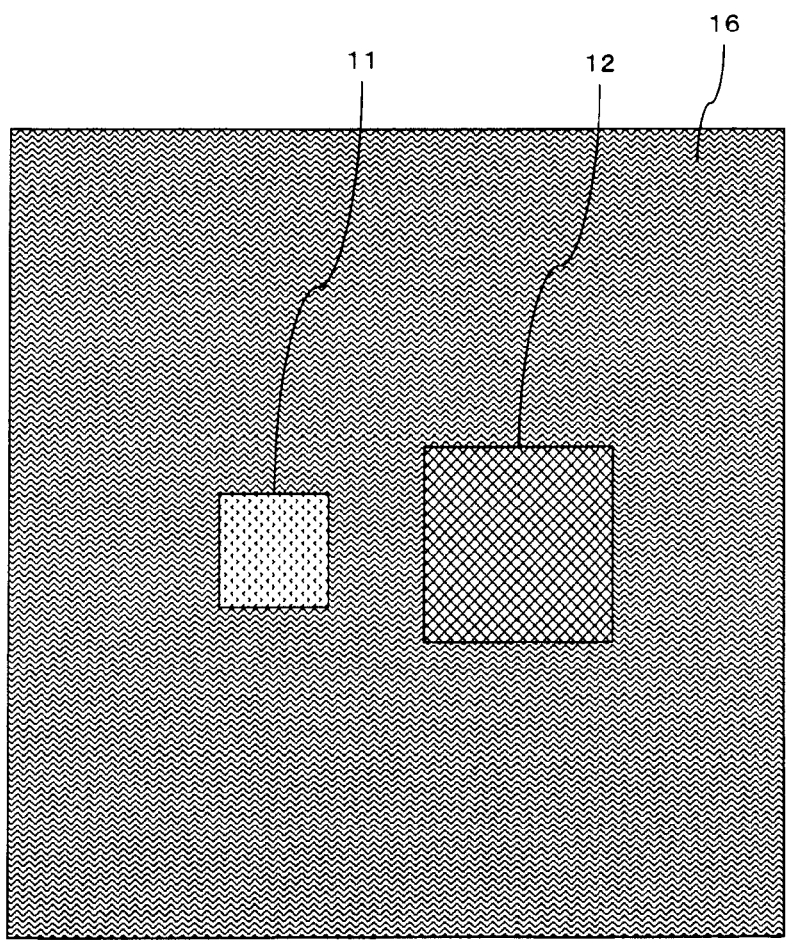
FIG. 3 is a plan view illustrating another layout example of built-in chips in the semiconductor element-embedded substrate according to the first exemplary embodiment of the present invention.

In FIG. 3, the LSI chip 11 is smaller in size than the TSV chip 12. Consequently, the substrate can be structured so as to include an LSI chip consistent with a trend toward a decreased chip size due to miniaturization, and a TSV chip consistent with a trend toward an increased number of pins and higher densification. Thus, it is possible to provide a semiconductor element-embedded substrate low in cost and capable of high-density packaging. In contradiction to the example illustrated in FIG. 3, the LSI chip 11 may be larger in size than the TSV chip 12. In that case, it is possible to arrange a plurality of small TSV chips, and thereby, increase design freedom.

In FIG. 4, a plurality of TSV chips 12 is arranged around the LSI chip 11. Consequently, it is possible to relieve stress to be exerted on the LSI chip 11 from the insulating layer 16 around the LSI chip 11, and therefore, reduce warpage. In addition, since a material higher in thermal conductivity than the insulating layer 16 is located around the LSI chip 11, the heat dissipation characteristics of the semiconductor element-embedded substrate 23 are improved.

Figure 5:
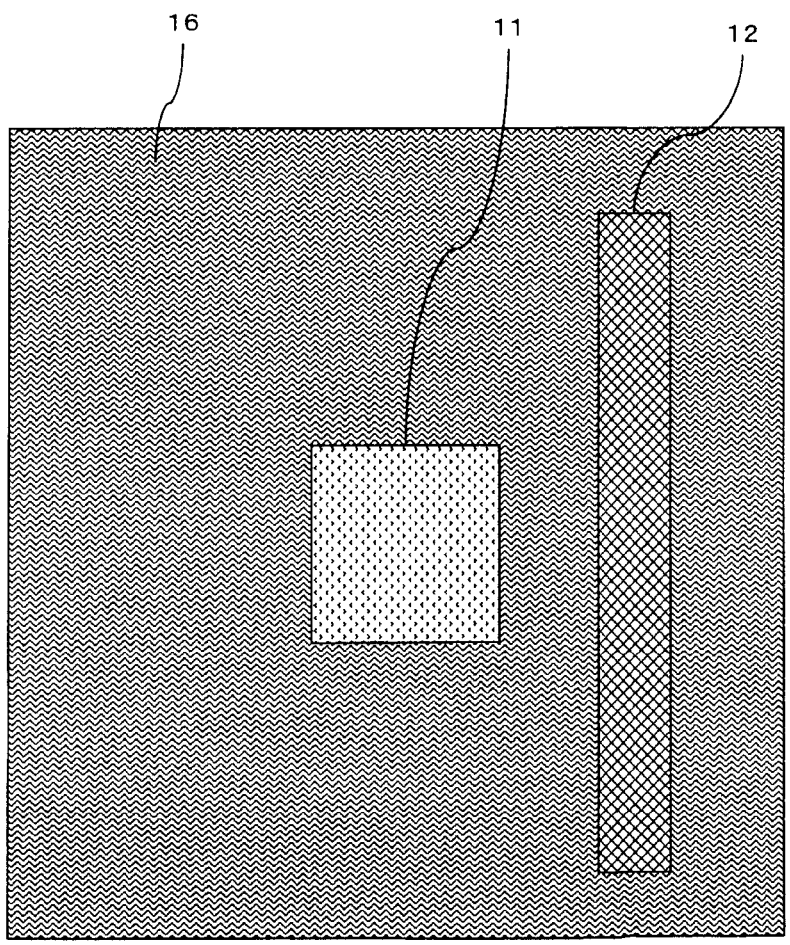
FIG. 5 is a plan view illustrating still another layout example of built-in chips in the semiconductor element-embedded substrate according to the first exemplary embodiment of the present invention.

As illustrated in FIG. 5, the TSV chip 12 and the LSI chip 11 can be rectangular and square in planar shape, respectively. If the TSV chip 12 is rectangular, the terminal pitch thereof can be relaxed according to a length of the TSV chip 12 in the longitudinal direction thereof, when the TSV chip 12 is positioned with the long side thereof facing the LSI chip 11. This makes it easy to reduce the number of terminal arrays, for example, to form a single array. As a result, relaxed wiring rules can be applied to wiring lines between the LSI chip 11 and the TSV chip 12. Thus, it is possible to improve the yield of wiring lines.

Figure 6:
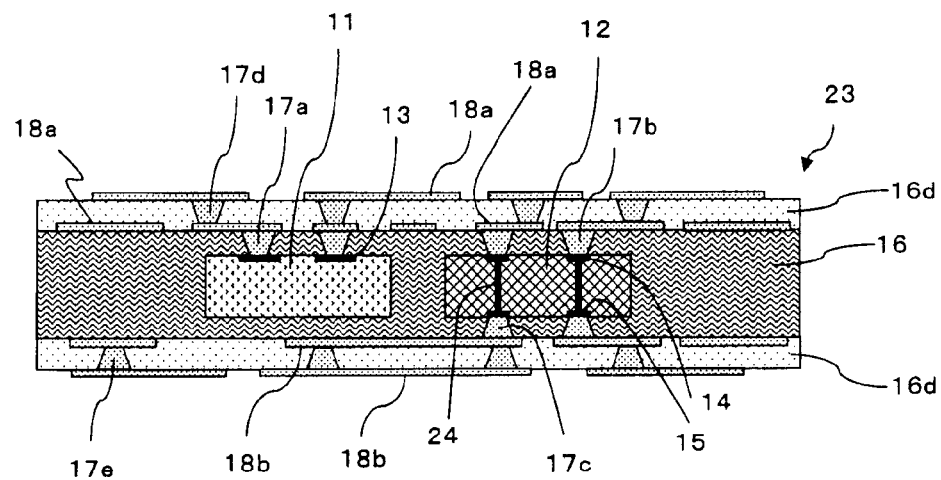
FIG. 6 is a cross-sectional view illustrating a modified example of the semiconductor element-embedded substrate according to the first exemplary embodiment of the present invention.

In the example illustrated in FIG. 1, both the upper surface-side wiring line and the lower surface-side wiring line are single-layered. Alternatively, as illustrated in FIG. 6, these wiring lines may have a multilayer interconnection structure in which two or more layers of the upper surface-side wiring lines and the lower surface-side wiring lines are provided respectively through insulating layers 16d. The top and bottom upper surface-side wiring lines can be connected to each other through a via 17d, and the top and bottom lower surface-side wiring lines can be connected to each other through a via 17e. In that case, power source characteristics and ground characteristics can be improved with an increase in the number of wiring line layers.

Figure 7:
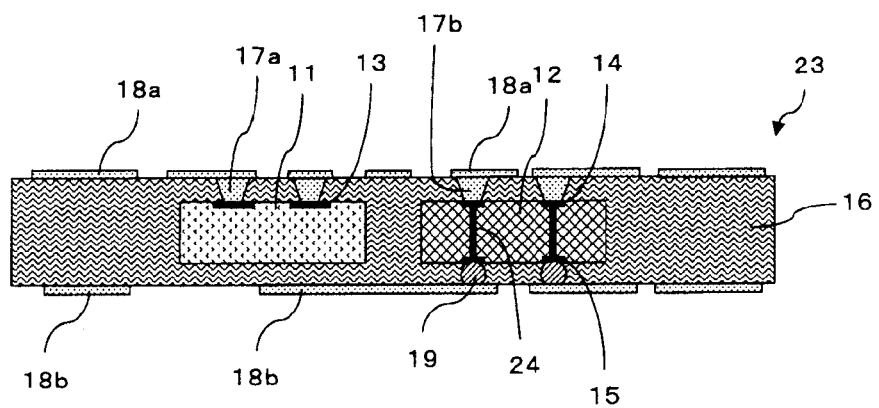
FIG. 7 is a cross-sectional view illustrating another modified example of the semiconductor element-embedded substrate according to the first exemplary embodiment of the present invention.

In the example illustrated in FIG. 1, the lower surface-side wiring line 18b of the semiconductor element-embedded substrate and the lower surface-side terminal 15 of the TSV chip are connected to each other through the via 17c. Alternatively, as illustrated in FIG. 7, the wiring line and the terminal may be connected to each other through a solder ball 19. In that case, it is easy to make an electrical connection with the wiring line 18b in a step of mounting the TSV chip. This is therefore advantageous in cost reduction. On the other hand, connection reliability improves further if a connection is made using a via rather than a solder ball or the like, as illustrated in FIG. 1.

Figure 8:
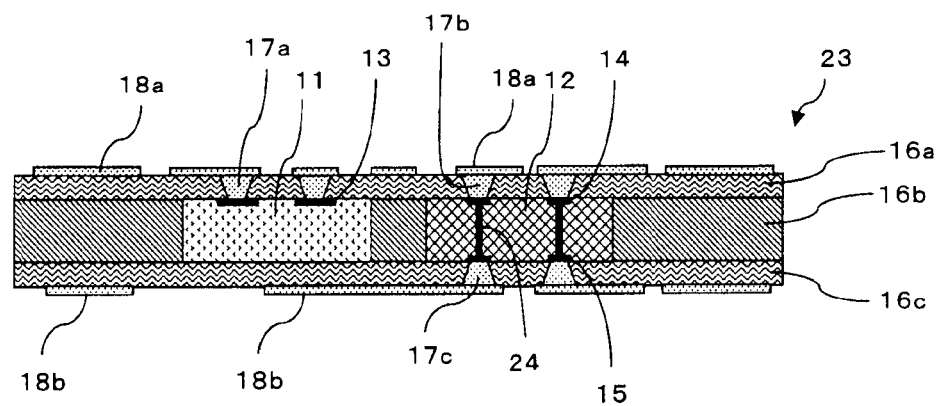
FIG. 8 is a cross-sectional view illustrating yet another modified example of the semiconductor element-embedded substrate according to the first exemplary embodiment of the present invention.

In another modified example of the structure illustrated in FIG. 1, the insulating layer covering the LSI chip 11 and the TSV chip 12 may have a laminated structure, as illustrated in FIG. 8. In the example illustrated in FIG. 8, this insulating layer is composed of an insulating layer 16c covering the lower surface sides of the chips, a lateral-to-chip insulating layer 16b provided on this insulating layer 16c and covering the peripheries of the chips, and an insulating layer 16a provided on this lateral-to-chip insulating layer 16b and covering the upper surface sides of the chips. Warpage can be reduced by forming the lateral-to-chip insulating layer 16b using high-rigidity insulating resin containing a reinforcing material, such as glass cloth. Fine wiring lines can be formed by lightly roughening the wiring line-formed surfaces of the upper and lower insulating layers 16a and 16c. Thus, it is possible to realize the narrowing of pitches and an increase in the number of pins of the built-in LSI chip 11 and TSV chip 12. This light roughening can be performed by wet-etching the surfaces of the insulating layers with a chemical solution or by dry etching the surfaces with plasma. Alternatively, this light roughening can be performed by pressing a member having a lightly-roughened surface against the surfaces of the insulating layers and thus transferring the lightly-roughened surface.

Figure 9:
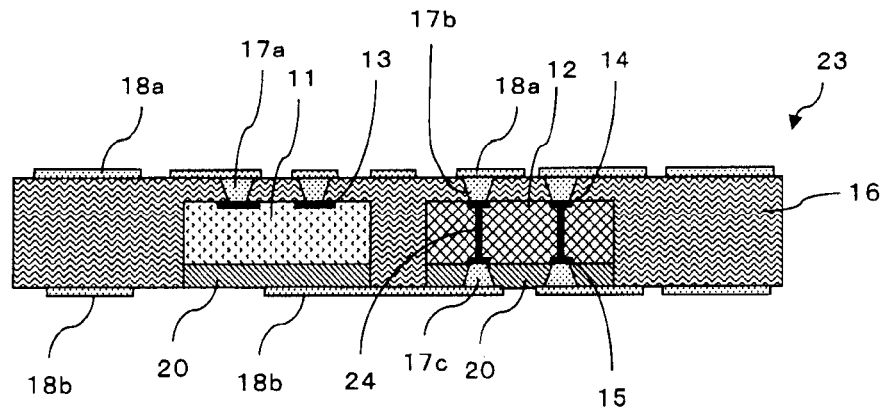
FIG. 9 is a cross-sectional view illustrating still another modified example of the semiconductor element-embedded substrate according to the first exemplary embodiment of the present invention.

In yet another modified example of the structure illustrated in FIG. 1, the LSI chip 11 and the TSV chip 12 are more strongly fixed onto adhesion layers 20 by providing the adhesion layers on the lower surfaces of the chips, as illustrated in FIG. 9. Consequently, it is possible to enhance the reliability of the chips in a thermal cycling test and the like. An adhesion layer may be provided in either the LSI chip 11 or the TSV chip 12. It is preferable, however, to provide adhesion layers in both of the chips.

The thicknesses (lengths in a direction perpendicular to the substrate plane) of the LSI chip 11 and the TSV chip 12 can be set according to the predetermined thickness of the semiconductor element-embedded substrate. For example, the thicknesses of the respective chips can be set to 50 to 100 μm.

If the planar shape (shape projected onto the substrate plane) of the LSI chip and the TSV chip is a polygon (convex polygon), such as a square or a rectangle, the length of a side is preferably 0.2 mm or longer, more preferably 1 mm or longer, from the viewpoint of processing accuracy or the like. From the viewpoint of downsizing, however, the length is preferably 15 mm or shorter, more preferably 12 mm or shorter. In this case, the boundary length of each chip is preferably 0.8 mm or longer, more preferably 4 mm or longer, but preferably 60 mm or shorter, more preferably 50 mm or shorter.

Although in the example illustrated in FIG. 1, only one each of the LSI chip 11 and the TSV chip 12 is shown, the substrate may include more than one each of the LSI chip 11 and the TSV chip 12. In the present exemplary embodiment, the substrate is configured to include one each of the LSI chip 11 and the TSV chip 12. This LSI chip 11 is provided with an LSI circuit. The TSV chip is not provided with any LSI circuits, but includes a TSV 24 within a silicon base material. The TSV can be formed so as to be narrow in pitch, high in aspect ratio, and small in diameter. The TSV 24 penetrates through the silicon base material, and renders the upper surface-side terminal 14 and the lower surface-side terminal 15 of the chip conductive to each other.

The outer diameter of the TSV can be set as appropriate, within the range of, for example, 0.1 μm to 100 μm. From the viewpoint of yields, the outer diameter is preferably 1 μm or larger, more preferably 10 μm or larger. From the viewpoint of the containing rate of TSVs, the outer diameter can alternatively be set to 10 μm or smaller. Typically, the TSV diameter can be set to, for example, 10 to 50 μm, and the pitch of TSVs can be set to, for example, 80 to 200 μm.

From the viewpoint of the miniaturization of the LSI chip, the containing rate of TSVs, and the like, the planar area of the TSV chip is preferably made larger than the planar area of the LSI chip. For example, the planar area of the TSV chip can be set as appropriate, within the range of 2 to 100 times the planar area of the LSI chip. From the viewpoint of the miniaturization of the LSI chip, the containing rate of TSVs, and the like, the planar area is preferably 10 or more times larger. From the viewpoint of the downsizing and yielding percentage of wiring substrates, however, the planar area is preferably 50 or less times larger, more preferably 20 or less times larger.

As the material of the insulating layer, it is possible to use, for example, a photosensitive or nonphotosensitive organic material. Examples of this organic material include epoxy resin, epoxy acrylate resin, urethane acrylate resin, polyester resin, phenol resin, polyimide resin, BCB (benzocyclobutene), PBO (polybenzoxazole), and polynorbornene resin. Alternatively, it is possible to use a material in which a reinforcing material, such as woven cloth or nonwoven cloth, formed of glass cloth or aramid fiber is impregnated with any of these organic materials. In the present exemplary embodiment, it is possible to suitably use, for example, epoxy resin which is nonphotosensitive resin, as the material of the insulating layer 16.

Examples of the material of wiring lines, terminals of chips, vias, and TSVs include copper, silver, gold, nickel, aluminum, titanium, molybdenum, tungsten, and palladium. As the material, it is possible to use one type of metal selected from these examples, or an alloy composed primarily of at least one type of metal selected from these examples. Copper is particularly desirable from the viewpoint of electrical resistance values and cost. In the present exemplary embodiment, it is possible to suitably use, for example, copper as the material of wiring lines, terminals, vias and TSVs.

In the semiconductor element-embedded substrate described above, a capacitor to serve as a circuit noise filter may be provided in a desired position of each layer. A dielectric material composing the capacitor is preferably a metal oxide, such as a titanium oxide, a tantalum oxide, $Al_2O_3$, $SiO_2$, $ZrO_2$, $HfO_2$, $Nb_2O_5$; a perovskite-based material, such as BST ($Ba_xSr_{1-x}TiO_3$), PZT ($PbZr_xTi_{1-x}O_3$) or PLZT ($Pb_{1-y}La_yZr_xTi_{1-x}O_3$) ($0<x<1$, $0<y<1$); or a Bi-based lamellar compound, such as $SrBi_2Ta_2O_9$. Also as the dielectric material composing the capacitor, an organic material or the like mixed with an inorganic material or a magnetic material may be used. Furthermore, discrete components may be provided in addition to the LSI chip and the capacitor.

Second Exemplary Embodiment

Figure 10:
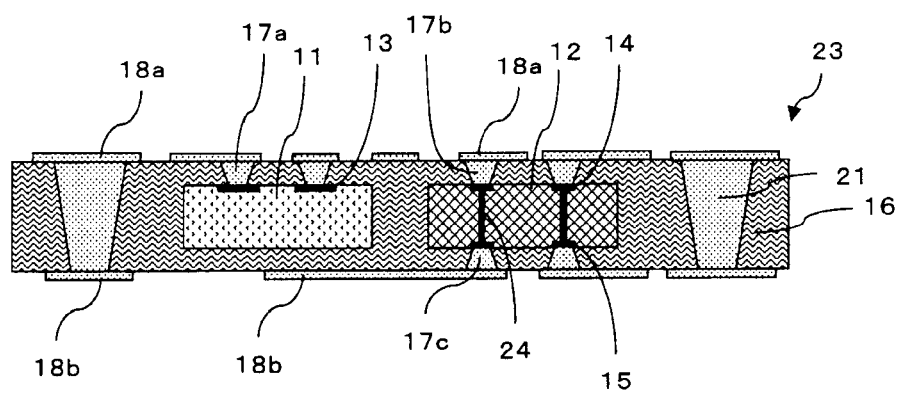
FIG. 10 is a cross-sectional view illustrating a semiconductor element-embedded substrate according to a second exemplary embodiment of the present invention.

FIG. 10 is a cross-sectional view illustrating a semiconductor element-embedded substrate according to a second exemplary embodiment. The semiconductor element-embedded substrate of the present exemplary embodiment is the same as that of the first exemplary embodiment, except that lateral-to-chip vias 21 for connecting the wiring lines 18a and 18b on the front and back sides of the semiconductor element-embedded substrate 23 are provided in portions of the insulating layer 16 lateral to the LSI chip 11 and the TSV chip 12.

Figure 11:
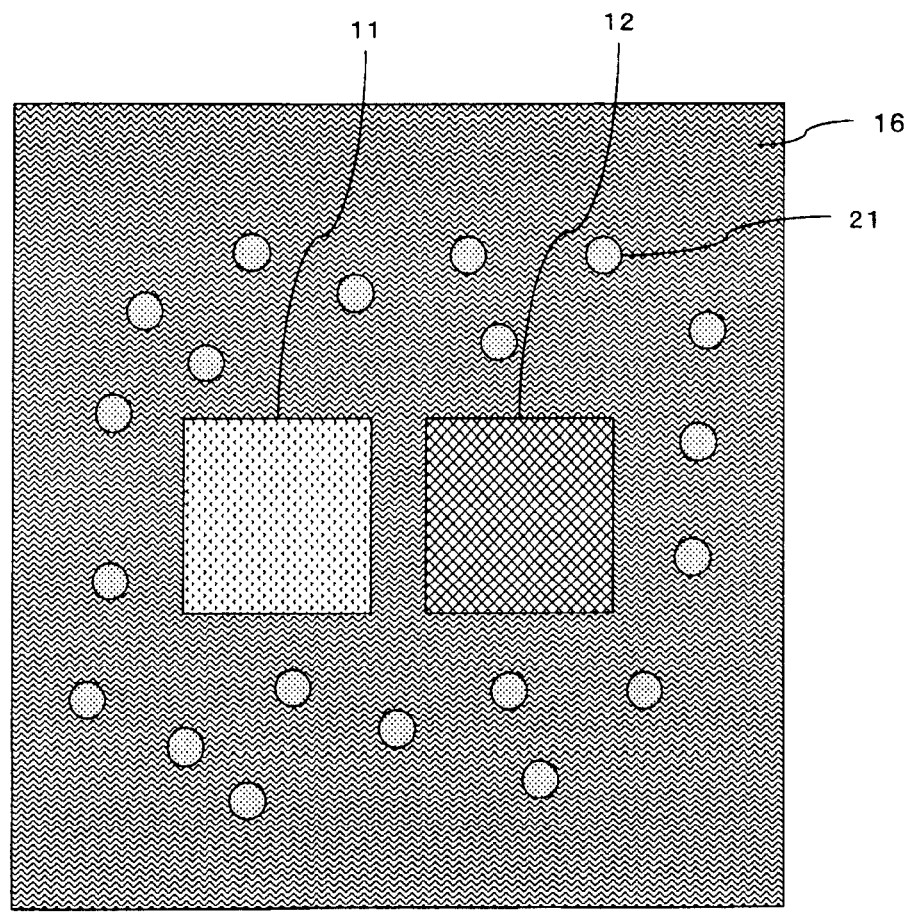
FIG. 11 is a plan view illustrating a layout example of built-in chips and lateral-to-chip vias in the semiconductor element-embedded substrate according to the second exemplary embodiment of the present invention.

FIG. 11 is a plan view illustrating a layout example of the built-in chips 11 and 12 and the lateral-to-chip vias 21 in the semiconductor element-embedded substrate according to the present exemplary embodiment. The lateral-to-chip vias 21 can be located in desired regions around the LSI chip 11 and the TSV chip 12. A lateral-to-chip via 21 may be located between the LSI chip 11 and the TSV chip 12.

Providing the lateral-to-chip vias 21 holds promise of improving heat dissipation characteristics and reducing the warpage of chips due to a reduction in stress in the lateral side direction thereof (planar direction of the substrate), in addition to being able to electrically connect the wiring lines 18a and 18b on the front and back sides of the semiconductor element-embedded substrate 23.

The lateral-to-chip vias 21 and the TSVs 24 can be electrically connected to terminals of the LSI chip through the upper surface-side wiring lines.

Examples of the material of each lateral-to-chip via 21 include copper, silver, gold, nickel, aluminum, titanium, molybdenum, tungsten, and palladium. As the material, it is possible to use one type of metal selected from these examples, or an alloy composed primarily of at least one type of metal selected from these examples. Copper is particularly desirable from the viewpoint of electrical resistance values and cost. In the present exemplary embodiment, it is possible to suitably use, for example, copper as the material of the lateral-to-chip vias 21.

The height (length in a direction perpendicular to the substrate plane) of each lateral-to-chip via 21 can be set greater than the heights of the built-in LSI chip 11 and TSV chip 12, for example, to 60 to 110 μm.

The outer diameter of each lateral-to-chip via can be set as appropriate, within the range of, for example, 10 μm to 300 μm. From the viewpoint of yielding percentage, the application of power and ground, and the like, the outer diameter is preferably 50 μm or larger, more preferably 100 μm or larger. From the viewpoint of the containing rate of lateral-to-chip vias and the like, however, the outer diameter is preferably 100 μm or smaller. Typically, the outer diameter of each lateral-to-chip via can be set to, for example, 50 to 100 μm, and the pitch thereof can be set to, for example, 150 to 500 μm. The outer diameter of each lateral-to-chip via can be set to, for example, approximately 2 to 100 times the outer diameter of a TSV. From the viewpoint of the yield of lateral-to-chip vias, the application of power and ground, and the like, the outer diameter is preferably 5 or more times larger, more preferably 10 or more times larger. From the viewpoint of the containing rate of lateral-to-chip vias and the like, however, the outer diameter is preferably 50 or less times larger, or may be set 10 or less times larger than the TSV diameter.

In the present exemplary embodiment, the pitch and via diameter of lateral-to-chip vias 21 can be made greater than the pitch and via diameter of TSVs 24. In this case, large power and ground can be applied through large-diameter, loose-pitched lateral-to-chip vias 21, and signals of multipin fine wiring lines can be conducted through small-diameter narrow-pitched TSVs 24. The electrical characteristics of the semiconductor element-embedded substrate can be improved by selectively using lateral-to-chip vias and TSVs according to applications, as described above.

Hereinafter, a description will be given of methods of manufacturing the semiconductor element-embedded substrates.

First Example of Manufacture

FIGS. 12(a) to 12(f) are cross-sectional views illustrating one example of a method of manufacturing a semiconductor element-embedded substrate in the order of steps. The semiconductor element-embedded substrate illustrated in FIG. 8 can be manufactured by this manufacturing method.

Figure 12:
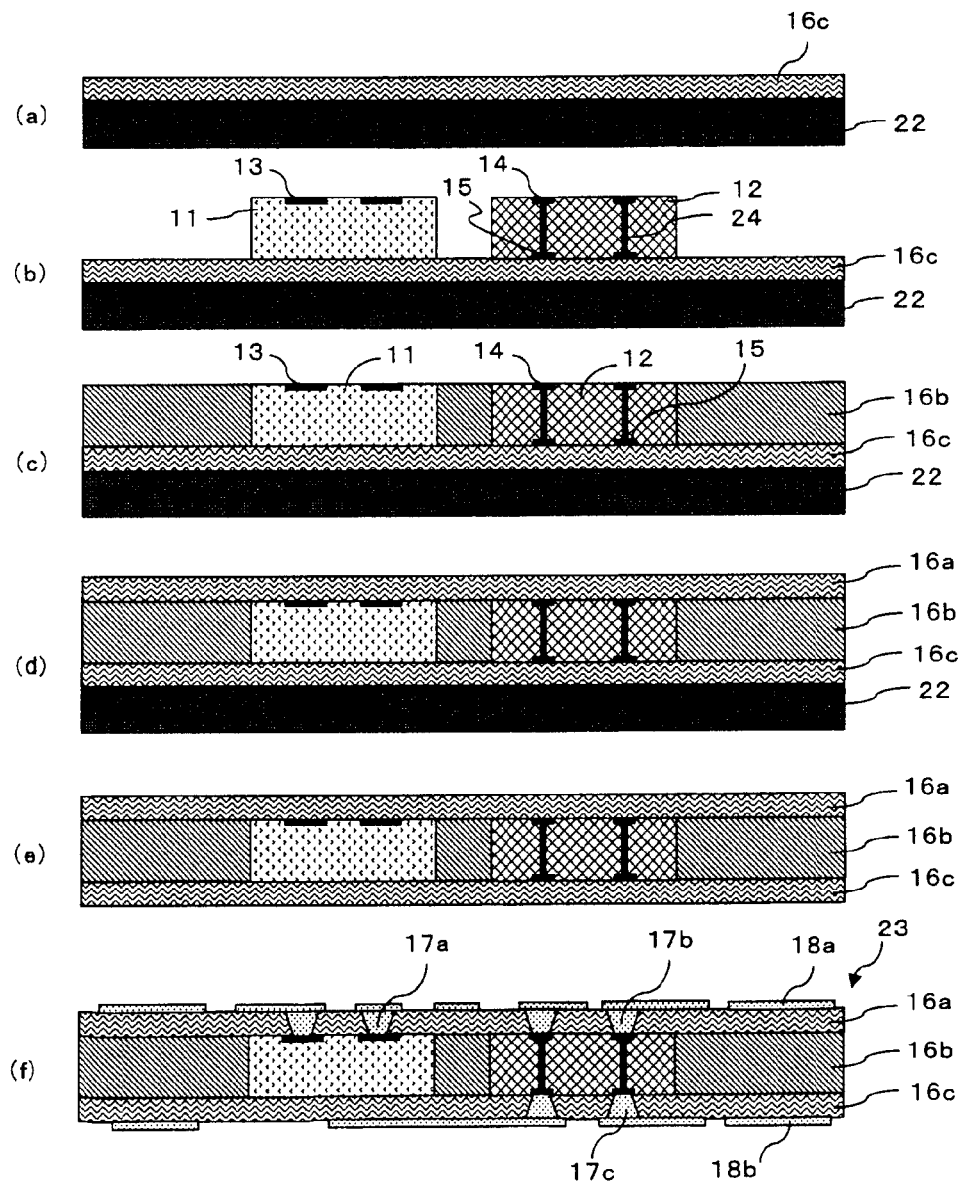
FIG. 12 is a cross-sectional view used to describe a method of manufacturing a semiconductor element-embedded substrate according to one exemplary embodiment of the present invention.

First, as illustrated in FIG. 12(a), an insulating layer 16c is formed on a support medium 22. The support medium 22 is desirably a high-rigidity material. It is preferable that position marks used to mount the LSI chip 11 and the TSV chip 12 are provided on the support medium 22. The position marks may be metal parts provided on the support medium 22 or dints provided by wet etching or machining, as long as the position marks can be precisely recognized through the insulating layer 16c and fulfill the functions required of a position mark. For example, a 0.5 mm-thick copper plate can be used as the support medium 22, a 20 to 50 μm-thick epoxy resin layer can be provided as the insulating layer 16c, and marks made of a nickel film can be formed as the position marks on the support medium 22 by electrolytic plating.

Next, as illustrated in FIG. 12(b), the LSI chip 11 is mounted on the insulating layer 16c on the support medium 22 with reference to the position marks, with a surface provided with the terminal 13 facing up. The TSV chip 12 is mounted in the same way as described above. At this time, adhesion layers are desirably present between the LSI chip 11 and the insulating layer 16c and between the TSV chip 12 and the insulating layer 16c. Alternatively, the insulating layer 16c may be formed from uncured resin and the upper surface of the insulating layer 16c may be utilized as an adhesive surface, without providing the adhesion layers.

Next, the lateral and upper portions of the LSI chip 11 and TSV chip 12 are covered with an insulating layer. First, as illustrated in FIG. 12(c), there is formed an insulating layer 16b for covering the circumferential side surfaces of the LSI chip 11 TSV chip 12. Thereafter, as illustrated in FIG. 12(d), there is formed an insulating layer 16a for covering the upper surfaces of these chips. The insulating layer 16b can contain a reinforcing material, such as glass cloth. As the insulating layer 16b, an insulating layer in which openings capable of accommodating chips are provided may be prepared and provided on the support medium 22.

Instead of this method, a filmy insulating material may be provided so as to collectively cover the upper surfaces and lateral portions of the LSI chip 11 and TSV chip 12. In this case, as illustrated in FIG. 1, an insulating layer 16 for covering the upper surfaces, side surfaces and lower surfaces of these chips can be formed by covering the surfaces with a material the same as that of the insulating layer 16c on the support medium 22. If these chips are provided through adhesion layers 20 without providing the insulating layer 16c on the support medium 22, the semiconductor element-embedded substrate illustrated in FIG. 9 can be formed. At that time, the lower surface side via 17c and wiring line 18b can be formed after a supporting substrate is removed.

Insulating layers can be formed using a transfer molding method, a compression molding method, a printing method, a vacuum pressing method, a vacuum laminating method, a spin coating method, a die coating method, a curtain coating method, or the like. If filmy insulating resin is used, a vacuum pressing method, a vacuum laminating method, or the like can be used. If liquid resin is used, a molding method, a coating method, or the like can be used. For example, the insulating layers 16a and 16b can be laminated by vacuum lamination using an epoxy resin film as insulating resin.

Next, as illustrated in FIG. 12(e), the support medium 22 is removed. The support medium 22 can be removed using such a method as wet etching, dry etching, physical delamination, or grinding. For example, a support medium made of a copper plate can be easily removed by wet etching.

Next, as illustrated in FIG. 12(f), there are provided a via 17a for connection with the terminal 13 of the LSI chip 11, and vias 17b and 17c for connection respectively with the terminal 14 and the terminal 15 of the TSV chip 12. Then, there are formed an upper surface-side wiring line 18a and a lower surface-side wiring line 18b.

A via hole can be formed by photolithography if an insulating layer in which this via hole is formed is made of a photosensitive material. If the insulating layer is made of a nonphotosensitive material or if the insulating layer is made of a material which is photosensitive but low in pattern resolution, the via hole can be formed by a laser processing method, a dry etching method or a blasting method. In the present example of manufacture, a via hole is formed by, for example, a laser processing method. Next, the abovementioned metal material is filled in this via hole to form a via for connection with a terminal of the chip. The metal material can be filled in the via hole by an electroplating method, an electroless plating method, a printing method, a molten metal suction method, or the like.

Instead of the above-described method of via formation, metal posts for electrical conduction may be previously provided on terminals of these chips, and an insulating layer for covering these metal posts may be formed. Thereafter, vias may be formed by abrading surfaces of the insulating layer by grinding or the like, thereby exposing surfaces of the metal posts. By such a formation method, it is possible to realize cost reductions and high yields.

The wiring line 18a can also be provided without providing the insulating layer 16a. In this case, the wiring line 18a and terminals of these chips can be connected without interposing any vias therebetween.

The wiring lines 18a and 18b can be formed by a subtractive method, a semi-additive method, a full-additive method, or the like. The subtractive method is a method of forming a resist of a desired pattern on copper foil provided on a substrate, etching away unnecessary portions of the copper foil, and then separating the resist, thereby obtaining a desired pattern. The semi-additive method is a method of forming a power supply layer by an electroless plating method, a sputtering method, a CVD (chemical vapor deposition) method, or the like, and then forming a resist having openings shaped into a desired pattern, depositing metal in the resist openings by an electroplating method, and removing the resist. Thereafter, the power supply layer is etched to obtain a desired wiring pattern. The full-additive method is a method of adsorbing an electroless plating catalyst onto a substrate, and then forming a pattern by using a resist, activating the catalyst while leaving this resist as an insulating film, and depositing metal in openings of the resist insulating film by an electroless plating method, thereby obtaining a desired wiring pattern. As a wiring material, it is possible to use any of the above-mentioned metal materials. Copper is particularly preferred from the viewpoint of electrical resistance and cost.

A protective insulating film (not illustrated) made of a solder resist or the like having an opening in which part of a wiring line is exposed may be provided, as necessary, on the upper surface side of an obtained semiconductor element-embedded substrate. Then, the exposed portion of the wiring line in this opening may be utilized as an external terminal. A conductive material may be provided in this opening to form a bump. Likewise, a protective insulating film (not illustrated) made of a solder resist or the like having an opening in which part of a wiring line is exposed may be provided, as necessary, on the lower surface side of the obtained semiconductor element-embedded substrate. Then, the exposed portion of the wiring line in this opening may be utilized as an external terminal. A conductive material may be provided in this opening to form a bump.

Insulating layers and wiring lines may be alternately provided on the upper surface side of the obtained semiconductor element-embedded substrate, as necessary, to form a multilayer interconnection structure thereon. Likewise, insulating layers and wiring lines may be alternately provided on the lower surface side of the obtained semiconductor element-embedded substrate, as necessary, to provide a multilayer interconnection structure thereon. In this way, there can be obtained, for example, the structure illustrated in FIG. 6. In FIG. 6, two layers of wiring lines and one insulating layer are provided in each multilayer interconnection structure. Alternatively, it is possible to provide three or more layers of wiring lines and two or more insulating layers. Yet alternatively, in this case, a protective insulating film, such as a solder resist, having an opening in which part of the uppermost layer-side wiring line of the multilayer interconnection structure is exposed may be provided on the upper surface side. Then, the exposed portion of the wiring line in this opening may be utilized as an external terminal. A conductive material may be provided in this opening to form a bump. Likewise, a protective insulating film, such as a solder resist, having an opening in which part of the lowermost layer side wiring line of the multilayer interconnection structure is exposed may be provided on the lower surface side. Then, the exposed portion of the wiring line in this opening may be utilized as an external terminal. A conductive material may be provided in this opening to form a bump.

Second Example of Manufacture

FIGS. 13(a) to 13(e) are cross-sectional views illustrating another example of a method of manufacturing a semiconductor element-embedded substrate in the order of steps.

Figure 13:
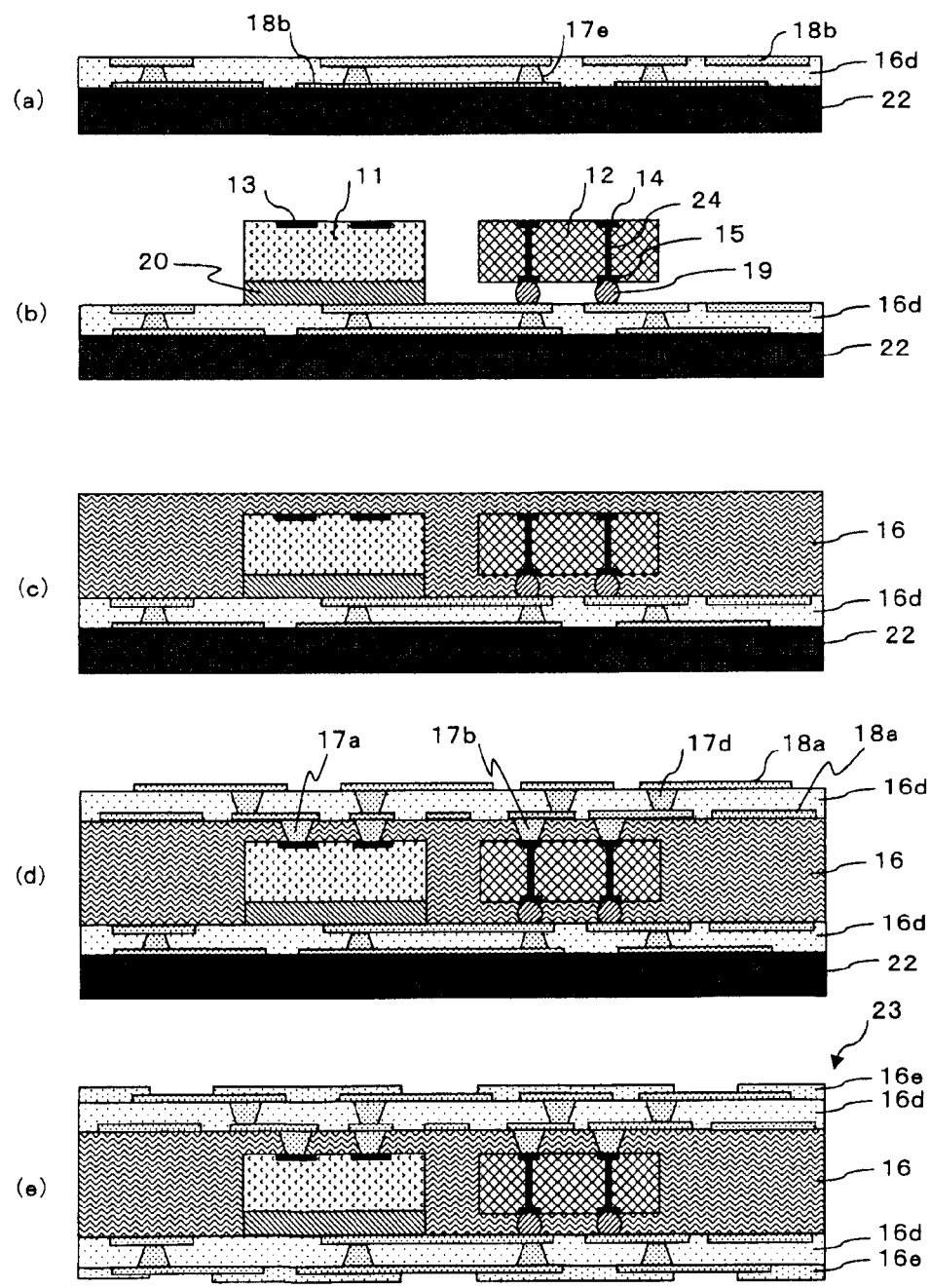
FIG. 13 is a cross-sectional view used to describe a method of manufacturing a semiconductor element-embedded substrate according to another exemplary embodiment of the present invention.

First, as illustrated in FIG. 13(a), a multilayer interconnection structure including a wiring line 18b, a via 17e, and an insulating layer 16d is formed on a support medium 22.

Next, as illustrated in FIG. 13(b), an LSI chip 11 is mounted on the multilayer interconnection structure on the support medium 22 through an adhesion layer 20. A TSV chip 12 is mounted so that the lower surface-side terminal 15 thereof is connected to a predetermined conductive part on the upper surface of the multilayer interconnection structure through a solder ball 19. Thus, electrical connection on the lower surface side is performed in a step of mounting the chips. This eliminates the need for a step of forming lower surface-side vias, thereby enabling the manufacture of the substrate at low cost.

Next, as illustrated in FIG. 13(c), there is formed an insulating layer 16 for covering the upper and side surfaces of these chips.

Next, as illustrated in FIG. 13(d), there are provided a via 17a for connection with the terminal 13 of the LSI chip 11, and a via 17b for connection with the terminal 14 of the TSV chip 12. There is formed a multilayer interconnection structure including an upper surface-side wiring lines 18a for electrical connection with these vias, an insulating layer 16d, and a via 17d.

Next, as illustrated in FIG. 13(e), the support medium 22 is removed. If the support medium and the wiring lines thereon are formed of the same material (for example, copper), the support medium can be selectively removed by wet etching by previously forming a barrier conductive film made of a material different in etching rate from the material of the support medium between the wiring lines and the support medium. If the removal accuracy of the support medium is within a desired range, the support medium may be removed by dry etching or grinding without forming the barrier conductive film.

Thereafter, there is provided a solder resist 16e having an opening in which part of the uppermost layer-side wiring line of the upper surface-side multilayer interconnection structure is exposed. The exposed part of the wiring line in this opening can be utilized as an external terminal. A conductive material may be provided in this opening to form a bump. Likewise, there is provided a solder resist 16e having an opening in which part of the lowermost layer side wiring line of the lower surface-side multilayer interconnection structure is exposed. The exposed part of the wiring line in this opening can be utilized as an external terminal. A conductive material may be provided in this opening to form a bump.

According to the manufacturing method of the present exemplary embodiment, it is possible to efficiently fabricate a semiconductor element-embedded substrate.

Third Example of Manufacture

FIGS. 14(a) to 14(e) are cross-sectional views illustrating yet another example of a method of manufacturing a semiconductor element-embedded substrate in the order of steps. By this manufacturing method, it is possible to manufacture a semiconductor element-embedded substrate provided with lateral-to-chip vias 21 penetrating through the insulating layers 16a, 16b and 16c in the structure illustrated in FIG. 8.

The present example of manufacture can be carried out in the same way as in the first example of manufacture, except that the lateral-to-chip vias 21 penetrating through the insulating layers 16a, 16b and 16c are formed laterally to the LSI chip 11 and the TSV chip 12.

Figure 14:
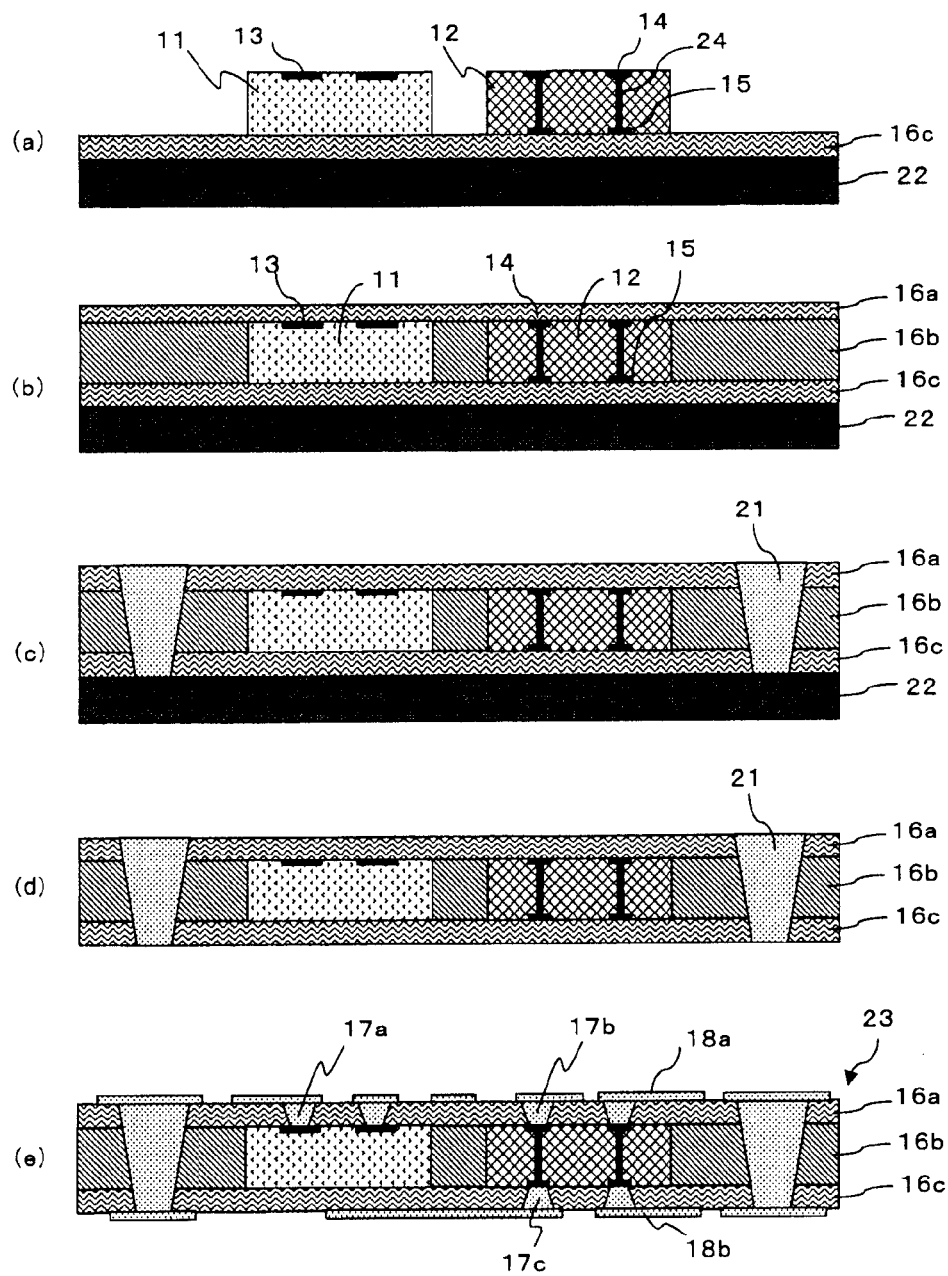
FIG. 14 is a cross-sectional view used to describe a method of manufacturing a semiconductor element-embedded substrate according to yet another exemplary embodiment of the present invention.

First, in the same way as in the first example of manufacture, the structure illustrated in FIG. 14(b) is obtained by way of the structure illustrated in FIG. 14(a).

Next, as illustrated in FIG. 14(c), there are formed the lateral-to-chip vias 21 penetrating through the insulating layers 16a, 16b and 16c around the LSI chip 11 and the TSV chip 12. The lateral-to-chip vias 21 can be formed by photolithography if these insulating layers are made of a photosensitive material. If these insulating layers are made of a nonphotosensitive material or if these insulating layers are made of a material which is photosensitive but low in pattern resolution, a via hole can be formed by a laser processing method, a dry etching method or a blasting method. In the present example of manufacture, the via hole is formed by, for example, a laser processing method. Next, the abovementioned metal material is filled in this via hole to form a lateral-to-chip via. The metal material can be filled in the via hole by an electrolytic plating method, an electroless plating method, a printing method, a molten metal suction method, or the like. In the present example of manufacture, an electrolytic plating method, for example, is used to form the lateral-to-chip via.

Next, as illustrated in FIG. 14(d), the support medium 22 is removed. Thereafter, as illustrated in FIG. 14(e), there are formed a via 17a for connection with the terminal 13 of the LSI chip 11 and a via 17b for connection with the terminal 14 of the TSV chip 12 in the same way as in the first example of manufacture. Then, there are formed a via 17c for connection with the lower surface-side terminal 15 of the TSV chip 12, and then an upper surface-side wiring line 18a and a lower surface-side wiring line 18b. The lateral-to-chip vias 21 may be formed simultaneously with the formation of the upper surface side vias 17a and 17b of the chips.

If the vias 17a and 17b on the chips 11 and 12 are formed using metal posts, a step of grinding surfaces of an insulating layer covering these metal posts to expose surfaces thereof may be carried out either after or before the formation of the lateral-to-chip vias 21.

While the present invention has been described with reference to the exemplary embodiments, the present invention is not limited to the above exemplary embodiments. Various changes that can be understood by those skilled in the art may be made to the constitution and details of the present invention within the scope thereof This application claims the right of priority based on Japanese Patent Application No. 2010-062776, filed on Mar. 18, 2010, the entire content of which is incorporated herein by reference.

REFERENCE SIGNS LIST

11 LSI chip
12 TSV chip
13 Terminal
14 Terminal
15 Terminal
16, 16a, 16b, 16c, 16d Insulating layer
16e Solder resist
17a, 17b, 17c, 17d, 17e Via
18a, 18b Wiring line
19 Solder ball
20 Adhesion layer
21 Lateral-to-chip via
22 Support
23 Semiconductor element-embedded substrate
24 TSV

The invention claimed is:

1. A semiconductor element-embedded substrate comprising:
a semiconductor element;
a chip component;
a peripheral insulating layer covering at least outer circumferential side surfaces of the semiconductor element and the chip component;
an upper surface-side wiring line provided on the upper surface side of the substrate; and
a lower surface-side wiring line provided on the lower surface side of the substrate,
wherein:
the semiconductor element comprises a terminal on the upper surface side thereof, the terminal being electrically connected to the upper surface-side wiring line,
the chip component comprises:
an upper surface-side terminal electrically connected to the upper surface-side wiring line;
a lower surface-side terminal electrically connected to the lower surface-side wiring line; and
a through-chip via penetrating through the chip component to connect the upper surface-side terminal and the lower surface-side terminal,
the semiconductor element comprises silicon substrate used as a base material,
the chip component comprises silicon substrate used as a base material, and
a plurality of the chip components is disposed such that the chip components surround the outer circumferential side surfaces of the semiconductor element.

2. The semiconductor element-embedded substrate according to claim 1, wherein the semiconductor element is a semiconductor chip including a semiconductor circuit, and the chip component is a chip component not including any semiconductor circuits.

3. The semiconductor element-embedded substrate according to claim 1, wherein the planar area of the chip component is larger than the planar area of the semiconductor element.

4. The semiconductor element-embedded substrate according to claim 1, wherein the terminal of the semiconductor element is connected to the upper surface-side wiring line through a via, the upper surface-side terminal of the chip component is connected to the upper surface-side wiring line through a via, and the lower surface-side terminal of the chip component is connected to the lower surface-side wiring line through a via.

5. The semiconductor element-embedded substrate according to claim 1, wherein
the terminal of the semiconductor element is connected to the upper surface-side wiring line through a via,
the upper surface-side terminal of the chip component is connected to the upper surface-side wiring line through a via, and
the lower surface-side terminal of the chip component is connected to the lower surface-side wiring line through a solder member.

6. The semiconductor element-embedded substrate according to claim 1, wherein the peripheral insulating layer comprises a lower surface-side insulating layer for covering the lower surface of the semiconductor element and the lower surface of the chip component; a reinforcing insulating layer for surrounding the outer circumferential side surfaces of the semiconductor element and the outer circumferential side surfaces of the chip component; and an upper surface-side insulating layer for covering the upper surface of the semiconductor element and the upper surface of the chip component.

7. The semiconductor element-embedded substrate according to claim 1, wherein a lateral-to-chip via penetrating through the peripheral insulating layer is provided in a region around the semiconductor element and the chip component.

8. The semiconductor element-embedded substrate according to claim 7, wherein the outer diameter of the lateral-to-chip via is larger than the outer diameter of the through-chip via.

9. The semiconductor element-embedded substrate according to claim 8, wherein power or ground is applied through the lateral-to-chip via and a signal is conducted through the through-chip via.

10. The semiconductor element-embedded substrate according to claim 1, further comprising a protective insulating film for covering the upper surface-side wiring line, the protective insulating film having an opening; and an external terminal formed of an exposed portion of the upper surface-side wiring line within the opening, or an external terminal formed of a conductive part provided in the opening.

11. The semiconductor element-embedded substrate according to claim 1, further comprising a multilayer interconnection structure comprising wiring lines and insulating layers alternately provided on the upper surface side of the substrate.

12. The semiconductor element-embedded substrate according to claim 11, further comprising an insulating film having an opening on the uppermost layer side of the multilayer interconnection structure on the upper surface side; and an external terminal formed of an exposed portion of a wiring line within the opening, or an external terminal formed of a conductive part provided in the opening.

13. The semiconductor element-embedded substrate according to claim 1, further comprising a multilayer interconnection structure comprising wiring lines and insulating layers alternately provided on the lower surface side of the substrate.

14. The semiconductor element-embedded substrate according to claim 13, further comprising an insulating film having an opening on the lowermost layer side of the multilayer interconnection structure on the lower surface side; and an external terminal formed of an exposed portion of a wiring line within the opening, or an external terminal formed of a conductive part provided in the opening.

15. The semiconductor element-embedded substrate according to claim 1, further comprising a protective insulating film for covering the lower surface-side wiring line, the protective insulating film having an opening; and an external terminal formed of an exposed portion of the lower surface-side wiring line within the opening, or an external terminal formed of a conductive part provided in the opening.

16. The semiconductor element-embedded substrate according to claim 1, wherein the planer shape of the semiconductor element is a square or a rectangle, and
the chip components are disposed on extensions of the diagonal lines of the semiconductor element.

17. The semiconductor element-embedded substrate according to claim 1, wherein
the planer shape of the semiconductor element is a square or a rectangle, and
the chip components are disposed such that the chip components are each opposed to the respective sides of the semiconductor element.

18. The semiconductor element-embedded substrate according to claim 1, wherein a distance between the chip component and the semiconductor element adjacent to the chip component is 1 μm or more and 500 μm or less.

19. The semiconductor element-embedded substrate according to claim 1, wherein the planner area of the chip component is larger than the planner area of the semiconductor element, and is 100 or less times larger than the planner area of the semiconductor element.

20. A method of manufacturing a wiring substrate comprising a semiconductor element built therein, the method comprising:
mounting a semiconductor element including a terminal on the upper surface side thereof on a support medium with the lower surface of the semiconductor element facing the support medium side;
mounting a chip component including terminals on the upper surface side and the lower surface side thereof on the support medium;
forming a peripheral insulating layer for covering the semiconductor element and the chip component;
removing the support medium;
forming a first wiring line for electrical connection with the lower surface-side terminal of the chip component; and
forming a second wiring line for electrical connection with the terminal of the semiconductor element and the upper surface-side terminal of the chip component,
wherein
the chip component includes a through-chip via penetrating through the chip component to connect the upper surface-side terminal and the lower surface-side terminal,
the semiconductor element comprises silicon substrate used as a base material,
the chip component comprises silicon substrate used as a base material, and
a plurality of the chip components is disposed such that the chip components surround the outer circumferential side surfaces of the semiconductor element.

21. The manufacturing method according to claim 20, further comprising forming a foundation insulating layer on the support medium, wherein the semiconductor element and the chip component are mounted on the foundation insulating layer.

22. The manufacturing method according to claim 20, wherein the semiconductor element and the chip component are respectively mounted through adhesion layers.

23. The manufacturing method according to claim 20, wherein the peripheral insulating layer comprises a first insulating layer surrounding the outer circumferential side surfaces of the semiconductor element and the chip component; and a second insulating layer covering the upper surfaces of the semiconductor element and the chip component.

24. The manufacturing method according to claim 23, wherein the first insulating layer includes a reinforcing material.

25. A method of manufacturing a wiring substrate comprising a semiconductor element built therein, the method comprising:
forming at least a first wiring line on a support medium;
mounting a semiconductor element including a terminal on the upper surface side thereof on the support medium with the lower surface of the semiconductor element facing the support medium side;

mounting a chip component including terminals on the upper surface side and the lower surface-side thereof on the support medium, such that the lower surface-side terminal is electrically connected to the first wiring line;

forming a peripheral insulating layer for covering the semiconductor element and the chip component;

removing the support medium; and forming a second wiring line for electrical connection with the terminal of the semiconductor element and the upper surface-side terminal of the chip component, wherein the chip component includes a through-chip via penetrating through the chip component to connect the upper surface-side terminal and the lower surface-side terminal, the semiconductor element comprises silicon substrate used as a base material, the chip component comprises silicon substrate used as a base material, and a plurality of the chip components is disposed such that the chip components surround the outer circumferential side surfaces of the semiconductor element.

26. The manufacturing method according to claim 25, wherein a multilayer interconnection structure including the first wiring line as an uppermost layer-side wiring line and including wiring lines and insulating layers alternately provided on the support medium is formed in the formation of the first wiring line, the semiconductor element and the chip component are mounted on the multilayer interconnection structure, and the lower surface-side terminal of the chip component is electrically connected to the first wiring line.

27. The manufacturing method according to claim 25, wherein the lower surface-side terminal of the chip component is connected to the first wiring line through a solder member.

28. The manufacturing method according to claim 25, wherein the peripheral insulating layer comprises a first insulating layer surrounding the outer circumferential side surfaces of the semiconductor element and the chip component; and a second insulating layer covering the upper surfaces of the semiconductor element and the chip component.

29. The manufacturing method according to claim 28, wherein the first insulating layer includes a reinforcing material.

* * * * *